(12) United States Patent
Braceras et al.

(10) Patent No.: US 6,441,646 B1
(45) Date of Patent: Aug. 27, 2002

(54) STRUCTURE AND METHOD OF ALTERNATING PRECHARGE IN DYNAMIC SOI CIRCUITS

(75) Inventors: George M. Braceras, Essex Junction, VT (US); Patrick R. Hansen, Mansfield, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,903

(22) Filed: Oct. 31, 2001

(51) Int. Cl.[7] ..................... H03K 19/091; H03K 19/003
(52) U.S. Cl. ........................................... 326/98; 326/28
(58) Field of Search ...................... 326/98, 95, 93, 326/112, 119, 121, 26–28

(56) References Cited

U.S. PATENT DOCUMENTS 6,002,271 A  * 12/1999  Chu et al. ...................... 326/98
6,094,072 A  *  7/2000  Davies et al. .................. 326/98
6,201,425 B1 *  3/2001  Kartschoke et al. ........ 327/211

* cited by examiner

*Primary Examiner*—Michael Tokar
*Assistant Examiner*—James H. Cho
(74) *Attorney, Agent, or Firm*—McGinn & Gibb, PLLC; Richard A. Henkler, Esq.

(57) ABSTRACT

A structure and method for reducing bipolar current in of a SOI circuit by alternating precharge low and precharge high methodologies comprises a reset signal source coupled to an inverter and a primary node, further coupled to a first and second PFET device; a clock signal source; coupled to a first NFET device and a third PFET device; a first input signal source coupled to a second NFET device and a fourth PFET device; a first NFET stack node coupled to the third PFET device, the first NFET device, the primary node, and the second NFET device; a second input signal source coupled to a third NFET device; a fifth PFET device coupled to the fourth PFET device; a power supply voltage source coupled to the fifth PFET device; and a second NFET node coupled to the fourth PFET device, the second NFET device, and the third NFET device.

11 Claims, 3 Drawing Sheets

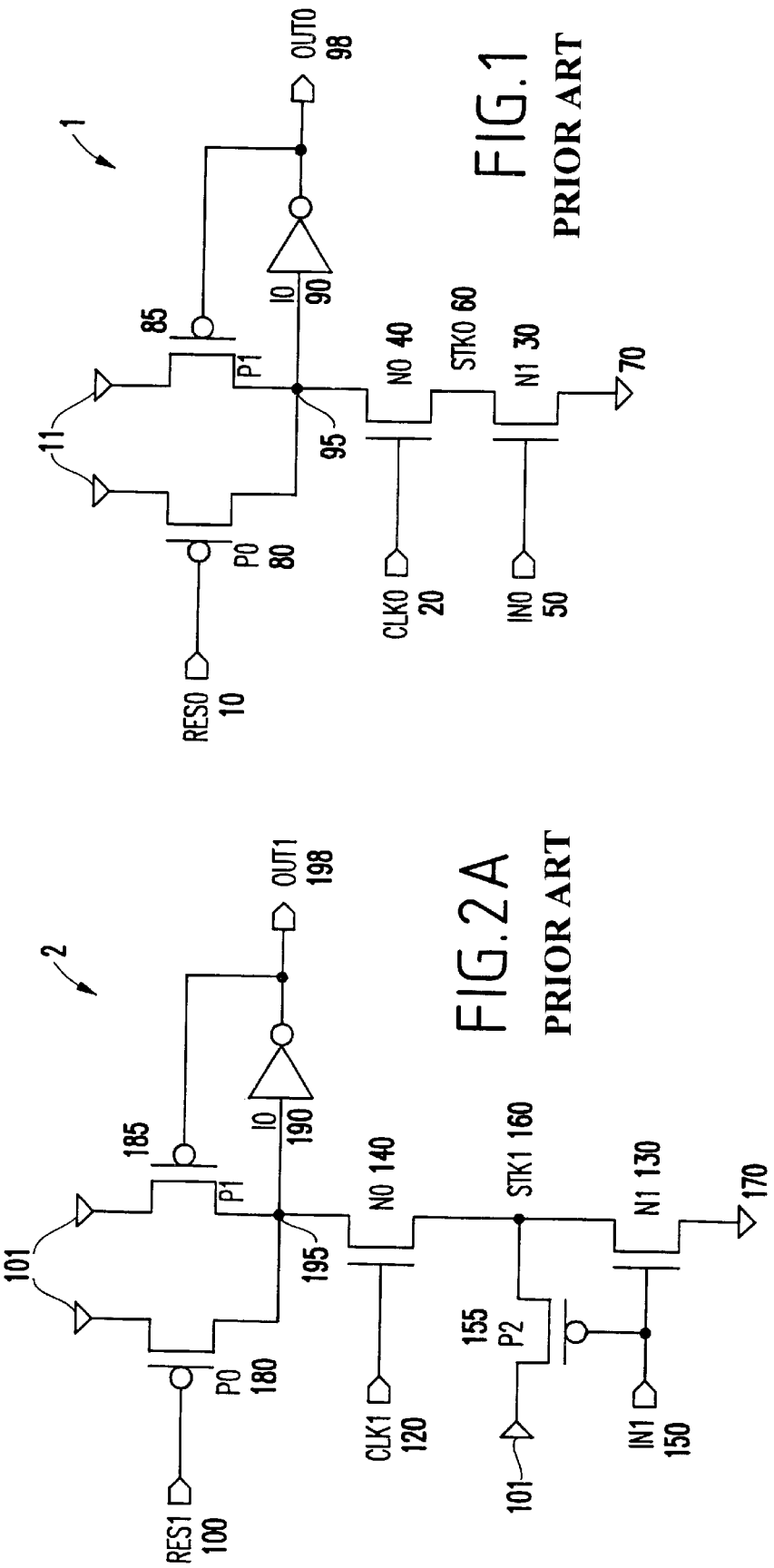

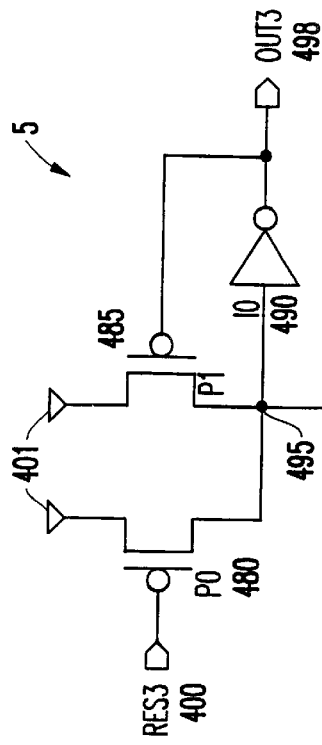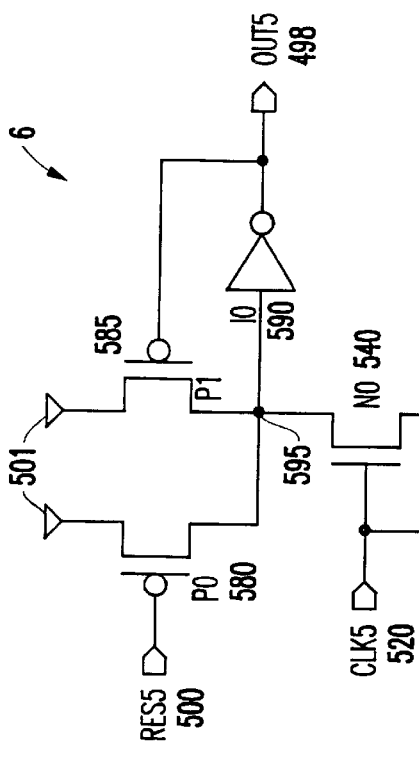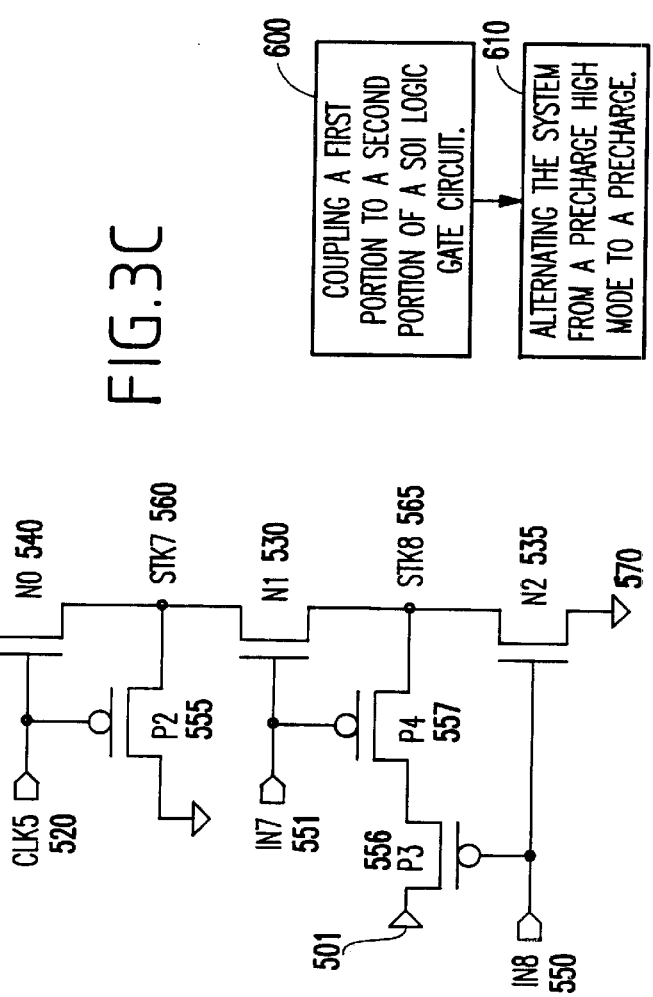

STRUCTURE AND METHOD OF ALTERNATING PRECHARGE IN DYNAMIC SOI CIRCUITS

BACKGROUND OF THE INVENTION

1. Field of the Invention

The present invention generally relates to SOI-related design methodologies, and more particularly to alternating precharge in dynamic logic SOI circuits for high speed, custom design applications.

2. Description of the Related Art

FIG. 1 illustrates a typical clocked domino-logic gate circuit 1. Reset signal 10 is shown separated from clock signal 20 as is often the case in self-resetting circuits, but those skilled in the art would recognize that these signals 10, 20 may also be tied together. Clock signal 20 often drives bottom NFET stack device 30 instead of top NFET stack device 40, but is connected to NFET stack device 40 in FIG. 1 to be consistent with typical SOI applications.

In bulk CMOS, charge-sharing has a significant impact on the circuit of FIG. 1. Charge sharing occurs when clock signal 20 remains low while input signal 50 pulses high. Under these conditions, intermediate NFET stack node 60 discharges to ground 70. In a subsequent cycle, input signal 50 remains low and clock signal 20 pulses high. During this subsequent clock cycle, charge is shared between the primary node 95 common to PFET device 80, PFET device 85, inverter 90, NFET stack device 40, and NFET stack node 60.

Furthermore, NFET stack node 60 charges to a level of $V_{dd}-V_{thn}$, where $V_{thn}$ is the body-effected threshold voltage of an NFET device, and $V_{dd}$ 11 is the power supply voltage. At the same time, the primary node 95 temporarily discharges to an intermediate level, the magnitude of which depends on the capacitance ratio between the primary node 95 and NFET stack node 60 and the strength of PFET device 85.

Because of the substantial source and drain capacitance of devices in bulk technologies, it is possible for charge sharing to discharge the primary node 95 sufficiently to cause an unintentional switching of inverter 90. This unintentional switching causes output node 98 to pulse high. Subsequent logic stages will therefore evaluate incorrectly, causing the chip to fail. This is a fundamental disadvantage and defect of this conventional circuit.

Several circuit techniques are applied to bulk circuits to minimize the effects of charge sharing. Increasing the strength of PFET device 85 in FIG. 1 reduces the magnitude of the charge-sharing excursion on the primary node 95. However, increasing the strength of PFET device 85 can significantly reduce performance. Therefore, it is generally not a desirable approach.

A more desirable (prior art) technique to eliminate charge sharing in bulk CMOS is the use of an intermediate node precharge circuit 2 illustrated in FIG. 2(A). PFET device 155 is added between the chip power supply source $V_{dd}$ 101 and the NFET stack node 160 to hold the NFET stack node 160 high as long as the input signal 150 is low. The result of this circuit modification is that, independent of the input sequencing of the clock input signal 120 and the input signal 150, the circuit 2 is immune to charge sharing and will evaluate correctly. The addition of device 155 adds some capacitive gate-loading to the input signal 150 as well as some diffusion capacitance to the NFET stack node 160, but can be made small enough to have a minimal performance impact. FIG. 3(A) shows this same technique applied to a three input clocked domino logic circuit 4.

While precharging the NFET stack node high in order to prevent charge sharing is a well established technique for bulk CMOS devices, it can cause problems for SOI CMOS circuits, which contain a parasitic bipolar device in parallel with the FET's channel. Activating the parasitic bipolar of the top NFET in the NFET logic stack (NFET 140 in FIG. 2(A)) is a concern for dynamic circuits, as the generated current can cause the primary node 195 to be unintentionally discharged.

In FIG. 2(A), the primary node 195 is at the power supply voltage $V_{dd}$ and the NFET stack node 160 is precharged by device 155 to the power supply voltage $V_{dd}$, then the body of NFET device 140 will settle to $V_{dd}$. The CLOCK input 120 remains low (circuit is not supposed to be selected) but input signal 150 pulses high, the source (collector) will be pulled to ground 170 through NFET device 130 and unintentional bipolar current will flow through NFET 140, possibly disturbing primary node 195.

The bipolar current occurs because the N-P-N transistor formed by the drain (emitter), body (base), and source (collector) of NFET stack device 140 is momentarily biased in the active gain region when the source is pulled to ground; the drain-body N-P diode is reversed-biased as the floating body of the NFET couples low with the source; and the source-body diode is forward-biased until the body couples low with the source. Because the intermediate precharge scheme of FIG. 2(A) allows the parasitic bipolar to be active, it is an undesirable circuit topology for SOI technology.

Bipolar currents can also be generated in the standard clocked domino circuit of FIG. 1. Here the primary node 95 is precharged to the power supply voltage $V_{dd}$ and the NFET stack node 60 is charged to $V_{dd}-V_{thn}$ (NFET threshold) from a previous cycle. For an SOI circuit 1 in this instance, the body of NFET device 40 will settle to a potential between $V_{dd}$ and $V_{dd}-V_{thn}$, and the bipolar structure will act similarly to that described above relating to FIG. 2(A). The clock signal 20 remains low while input signal 50 pulses high, bipolar current flows through NFET device 40 and reduces the potential of the primary node 95 sufficiently to cause unintentional switching of output 98.

Fortunately for SOI technologies, the isolation of source and drain diffusions from the bulk silicon reduces the capacitance of these nodes by approximately 25%. One benefit of this reduced capacitance is that charge sharing, though still present, is of a much lower magnitude and concern, and circuit topologies can be developed to address eliminating the bipolar currents.

The intermediate precharge-low circuit 3 approach illustrated in FIG. 2(B) is a prior art technique which eliminates bipolar current concerns for domino logic. NFET stack node 260 is precharged to $V_{thp}$, where $V_{thp}$ is the body-effected threshold voltage of a PFET device. In this precharged state, the body of NFET device 240 will settle to a potential between the power supply voltage $V_{dd}$ and $V_{thp}$. This voltage is low enough to prevent the source-body junction from forward-biasing when the source node of NFET 240 (stack node 260) is pulled to ground. With this biasing scheme in place, if input clock signal 220 remains low while input signal 250 switches high, NFET stack node 260 will transition from $V_{thp}$ to ground 270 without causing bipolar currents. The power supply voltage $V_{dd}$ is shown as 201.

As with the precharge-high approach to charge-sharing, the precharge-low approach to bipolar currents imposes additional gate capacitance on the inputs and diffusion capacitance on NFET stack node 260. Similarly, PFET precharge device 255 can be made small enough to have a minimal performance impact on a two-high NFET stack 230, 240. However, there is an additional performance penalty in SOI circuits for causing the bodies of NFET devices 230 and 240 to settle to lower potentials than would in an identical circuit without precharge-low device 255.

Moreover, with the body potential of NFET device 240 between $V_{dd}$ and $V_{thp}$, and the body potential of NFET device 230 between $V_{thp}$ and ground 270, the threshold voltages of NFET devices 240 and 230 are significantly higher than they would be without the precharge-low device 255. Thus, these higher threshold voltages slow the discharge of the primary node 295 through the NFET stack node 260 during circuit evaluation, thereby reducing chip performance. For dynamic NFET stacks of two, this performance impact is small and far better than the consequences of having the circuit fail due to unanticipated bipolar currents. However, for dynamic NFET stacks of three or greater (as shown in FIGS. 3(B)), the performance impact of this method is substantial.

Thus, there remains a need for a new and improved dynamic logic circuit with an alternating precharge scheme, which results in a faster discharge of the primary node in the circuit, resulting in a substantial performance improvement of the chip.

BRIEF SUMMARY OF THE INVENTION

In view of the foregoing and other problems, disadvantages, and drawbacks of the conventional dynamic logic circuits, the present invention has been devised, and it is an object of the present invention to provide a structure and method for a new and improved dynamic logic circuit with an alternating precharge scheme. It is another object of the present invention to provide a logic circuit, which results in a faster discharge of the primary node in the circuit. Still another object of the present invention is to provide a logic circuit, which results in a substantial improvement in the logic performance of the chip.

In order to attain the objects suggested above, there is provided, according to one aspect of the invention, a method and system for reducing bipolar current in a SOI (silicon-on-insulator) circuit comprising a first portion operatively connected to a second portion, wherein the system alternates from a precharge high mode to a precharge low mode.

Specifically, the structure for reducing bipolar current in a SOI circuit by alternating precharge low and precharge high methodologies comprises a reset signal source 500; a first PFET device 580 coupled to the reset signal source 500; a second PFET device 585 coupled to an output signal source 498; an inverter 590 coupled to the output signal source 498; a clock signal source 520; a first NFET device 540 coupled to the clock signal source 520; a third PFET device 555 coupled to the clock signal source 520; a first NFET stack node 560 coupled to the third PFET device 555; a first input signal source 551; a second NFET device 530 coupled to the first input signal source 551; a fourth PFET device 557 coupled to the first input signal source 551; a second NFET stack node 565 coupled to the fourth PFET device 557; a second input signal source 550; a third NFET device 535 coupled to the second input signal source 550; and a fifth PFET device 556 coupled to the second input signal source 550, the power supply voltage source 501, and the fourth PFET device 557.

Moreover, the clock signal source 520 causes the first NFET stack node 560 to be precharged to a body-effected threshold voltage $V_{thp}$ of the third PFET device 555.

The first input signal 551 and the second input signal source 550 cause the second NFET stack node 565 to be precharged to the power supply voltage $V_{dd}$ through both the fourth PFET device 557 and fifth PFET device 556. With the source region of the first NFET device 540 at $V_{thp}$ and the drain region of the first NFET device 540 (primary node 595 precharged to $V_{dd}$ by restore device 580) at the power supply voltage $V_{dd}$, the body potential of the first NFET device 540 will settle to a level between the power supply voltage $V_{dd}$ and a body-effected threshold voltage $V_{thp}$ of the third PFET device 555.

Furthermore, the body potential of the second NFET device 530 settles to a level between $V_{dd}$ and $V_{thp}$, due to the fact that the second NFET device's 530 source voltage is $V_{dd}$ and it's drain voltage is at $V_{thp}$. The first input signal source 551 causes the second NFET device 530 to have a body potential in between a body-effected threshold voltage $V_{thp}$ of the fourth PFET device 557 and a power supply voltage $V_{dd}$. Likewise, the voltage of the second NFET stack node 565 results in the third NFET device 535 to have a body potential in between $V_{thp}$ and ground 570.

Additionally, the first, second, and third NFET devices 540, 530, and 535, respectively, each comprise a source and drain region. Specifically, the first NFET device 540 comprises a source region 560, which is also the first NFET stack node 560; and a drain region 595, which is also the primary node 595. Similarly, the second NFET device 530 comprises a source region 565, which is also the second NFET stack node 565; and a drain region 560, which is also the first NFET stack node 560. Also, the third NFET device 535 comprises a source region 570 (ground); and a drain region 565, which is also the second NFET stack node 565.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which:

FIG. 1 is a schematic diagram of a conventional logic circuit;

FIG. 2(A) is a schematic diagram of a conventional 2-input logic circuit;

FIG. 3(B) is a schematic diagram of a conventional 3-input logic circuit;

FIG. 3(C) is a schematic diagram of a preferred embodiment of a logic circuit according to the present invention; and FIG. 4 is a flow diagram illustrating a preferred method of the present invention.

DETAILED DESCRIPTION OF THE INVENTION

DETAILED DESCRIPTION OF PREFERRED EMBODIMENTS OF THE INVENTION

As mentioned above, there is a need for a new and improved dynamic logic circuit, which results in a faster discharge of the primary node in the circuit, resulting in a substantial improvement in the logic performance of the chip.

Figure 2B:
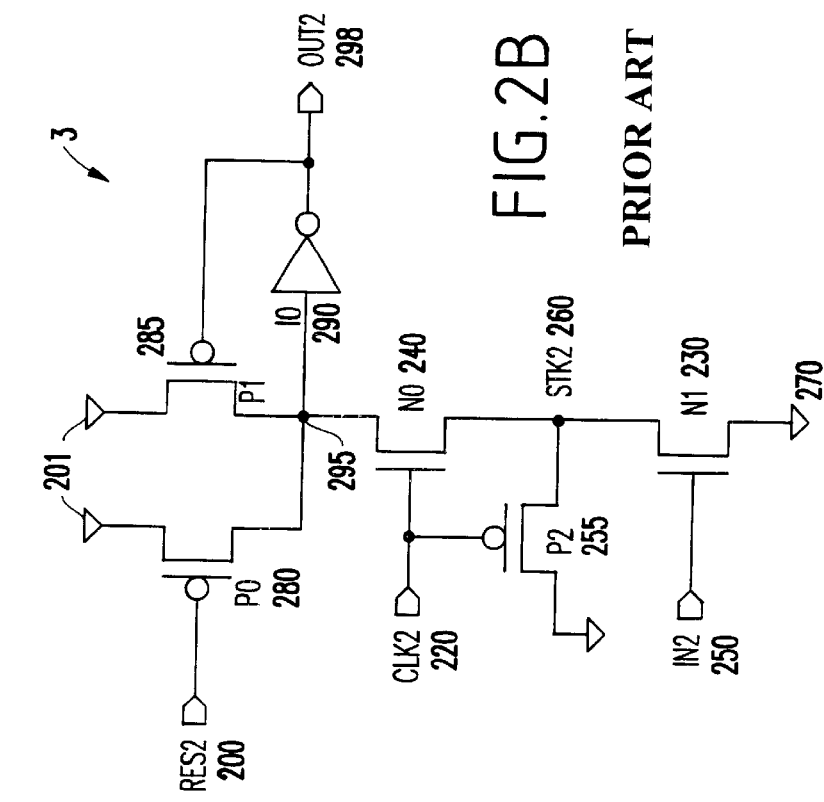
FIG. 2(B) is a schematic diagram of a conventional 2-input logic circuit.
Figure 3A:
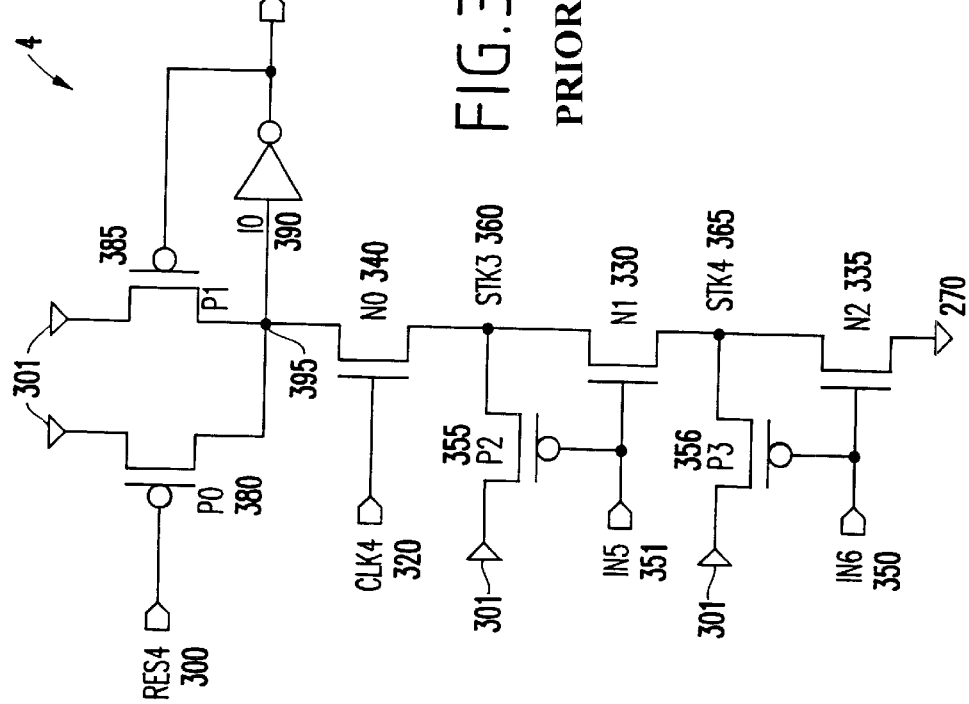
FIG. 3(A) is a schematic diagram of a conventional 3-input logic circuit.

Referring now to the drawings, and more particularly to FIGS. 3(C) and 4, there are shown preferred embodiments of the method and structures according to the present invention. FIGS. 3(C) and 4 illustrate a preferred embodiment of an alternating precharge-low, precharge-high circuit 6 and methodology to enhance logic performance in SOI technologies.

Reset signal 500 is shown separated from clock signal 520 as is often the case in self-resetting circuits, but those skilled in the art would recognize that these signals 500, 520 may also be tied together. Reset signal 500 drives PFET device 580, which is coupled to the primary node 595, which is connected to inverter 590 and PFET device 585. PFET device 580, which is connected between $V_{dd}$ 501 and the primary node 595, has its gate connected to reset signal 500. Also, PFET device 585, which is connected between $V_{dd}$ 501 and the primary node 595, has its gate connected to output signal 498. Clock signal 520 drives NFET stack device 540, and is further coupled to PFET device 555, which in turn is connected to NFET stack node 560.

Furthermore, input signal 551 is coupled to PFET device 557 and NFET stack device 530. However, PFET device 557 is also connected to ground and to NFET stack node 565. Also, input signal 550 is coupled to both PFET device 556 and NFET stack device 535. Moreover, PFET device 556 is connected to the power supply source $V_{dd}$ 501 and PFET device 557, which then connects to NFET stack node 565.

More specifically, the structure for reducing bipolar current in a SOI circuit by alternating precharge low and precharge high methodologies comprises a reset signal source 500; a first PFET device 580 coupled to the reset signal source 500; a second PFET device 585 coupled to an output signal source 498; an inverter 590 coupled to the output signal source 498; a clock signal source 520; a first NFET device 540 coupled to the clock signal source 520; a third PFET device 555 coupled to the clock signal source 520; a first NFET stack node 560 coupled to the third PFET device 555; a first input signal source 551; a second NFET device 530 coupled to the first input signal source 551; a fourth PFET device 557 coupled to the first input signal source 551; a second NFET stack node 565 coupled to the fourth PFET device 557; a second input signal source 550; a third NFET device 535 coupled to the second input signal source 550; and a fifth PFET device 556 coupled to the second input signal source 550, the power supply voltage source 501, and the fourth PFET device 557.

Moreover, the clock signal source 520 causes the first NFET stack node 560 to be precharged to a body-effected threshold voltage $V_{thp}$ of the third PFET device 555. The first input signal 551 and the second input signal source 550 causes the second NFET stack node 565 is precharged to the power supply voltage $V_{dd}$ through the fourth 557 and fifth 556 PFET devices. With the source of the first NFET device 540 at $V_{thp}$ and the drain of the first NFET device 540 (primary node 595 precharged to V by restore device 580) at the power supply voltage $V_{thp}$, the body potential of the first NFET device 540 will settle to a level between the power supply voltage $V_{dd}$ and a body-effected threshold voltage $V_{thp}$ of the third PFET device 555.

Furthermore, the body potential of the second NFET device 530 will also settle to a level between $V_{dd}$ and $V_{thp}$, due to the fact that the second NFET device's 530 source voltage is $V_{dd}$ and it's drain voltage is at $V_{thp}$. The first input signal source 551 causes the second NFET device 530 to have a body potential in between a body-effected threshold voltage $V_{thp}$ of the fourth PFET device 557 and a power supply voltage $V_{dd}$. Likewise, the voltage of the second NFET stack node 565 results in the third NFET device 535 to have a body potential in between $V_{dd}$ and ground 570.

Additionally, the first, second, and third NFET devices 540, 530, and 535, respectively, each comprise a source and drain region. Specifically, the first NFET device 540 comprises a source region 560, which is also the first NFET stack node 560; and a drain region 595, which is also the primary node 595. Similarly, the second NFET device 530 comprises a source region 565, which is also the second NFET stack node 565; and a drain region 560, which is also the first NFET stack node 560. Also, the third NFET device 535 comprises a source region 570 (ground); and a drain region 565, which is also the second NFET stack node 565.

In FIG. 4, a flow diagram illustrating the preferred method for reducing bipolar current in a SOI (silicon-on-insulator) circuit 6 is shown comprising coupling 600 a first portion to a second portion of the circuit 6, and alternating 610 the SOI circuit 6 from a precharge high mode to a precharge low mode.

Circuit 6 of FIG. 3(C) achieves an improved performance relative to the precharge-low method of circuit 5 by causing the body potentials of devices 540 and 530 in the NFET stack to settle to a potential between $V_{dd}$ and $V_{thp}$; and the body potential of device 535 to settle to a potential between $V_{dd}$ and ground. Precharging nodes 460 and 465 of circuit 5 (FIG. 3(B)) to $V_{thp}$ causes the body potentials of NFET devices 440, 430, and 435 to be between $V_{dd}$ and $V_{thp}$, approximately $V_{thp}$, and between $V_{thp}$ and ground 470, respectively.

In contrast, NFET nodes 560 and 565 of circuit 6 (FIG. 3(C)) are precharged to $V_{thp}$ and $V_{thp}$, respectively. These precharge potentials cause the body potentials of NFET devices 540, 530, and 535 to be between $V_{dd}$ and $V_{thp}$, between $V_{thp}$ and $V_{dd}$, and between $V_{dd}$ and ground 570, respectively. This occurs because the PFET device 555 precharges node 565 to a PFET threshold voltage $V_{thp}$ above ground when it's input signal 520 is low. The PFET device 555 attempts to pull NFET stack node 560 to ground, but it is unable to because the PFET channel cuts-off when the source voltage (NFET stack node 560) reaches the PFET threshold voltage $V_{thp}$.

On the other hand, NFET stack node 565 is precharged to the power supply voltage $V_{dd}$ through PFET devices 556 and 557 when both the first input signal 551 and second input signal 550 are low (for the clocked domino structure all inputs are preset low, and only pulse high when the circuit is accessed). Circuit 5 shown in FIG. 3(B), however, precharges all of the stack nodes 460, 465 to the same potential $V_{thp}$. This results in NFET device 440 to be biased between $V_{dd}$ (the primary node 495 is precharged to $V_{dd}$ through PFET device 480) and $V_{thp}$; NFET device 430 to be biased between $V_{thp}$ and $V_{thp}$; and NFET device 435 to be biased between $V_{thp}$ and ground 470.

Moreover, these elevated body potentials in the alternating precharge method result in a faster discharge of the primary node for circuit 6, compared to circuit 5, which results in a performance improvement at the output 498. The body voltage of a device directly affects it's threshold voltage, and therefore it's switching speed. For an NFET device, biasing the body above the source potential reduces the device threshold voltage $V_{thn}$ and improve the device's performance. For a PFET device, biasing the body below the source voltage reduces its threshold voltage $V_{thp}$ and improve it's performance.

In most bulk CMOS structures the body voltages are fixed to either ground for the NFETs, or $V_{dd}$ for the PFETs. In SOI devices the body is isolated and left floating. The voltage, which the body will settle to, is determined by the voltages on the device's source and drain. The circuit 5 of FIG. 3(B) biases all of the stack nodes to $V_{thp}$. This allows the body of NFET device 440 to settle between $V_{dd}$ and $V_{thp}$ (this will be about ½ $V_{thp}$).

Moreover, the body of NFET device 430 settles between $V_{thp}$ and $V_{thp}$ (this is relatively close to ground). Also, the body of NFET device 435 will settle between $V_{thp}$ and ground (this is close to ground). Because the bodies of NFET devices 430 and 435 settle close to ground, the circuit 5 is slower than if the NFET devices 430, 435 are biased, as taught by the present invention, namely circuit 6 of FIG. 3(C). This is one of the fundamental benefits of the present invention. Here, the body of NFET device 540 settles between $V_{dd}$ and $V_{thp}$; the body of NFET device 530 also settles between $V_{dd}$ and $V_{thp}$; and the body of NFET device 535 settles between $V_{dd}$ and ground 570. All of these potentials are low enough to prevent generating the bipolar currents, but high enough to provide more performance than the biasing of circuit 5 of FIG. 3(B).

The precharge methodology of circuit 6 further provides improved performance and more uniform body potentials. Uniform body potentials result in devices with similar threshold values, which in turn allows each device to have similar performance characteristics. For some semiconductors, it is important that the logic circuits respond the same to any of the inputs, thereby making the circuits' behavior more predictable.

In fact, all bodies in the NFET stacks of three and higher settle to very nearly the same potential (except the bottom device for stacks having an even number of NFET stack devices). The three input stack is biased as follows:

$V_{dd}$-NFET1-$V_{thp}$-NFET2-$V_{dd}$-NFET3-GND

The four input stack is biased as follows:

$V_{dd}$-NFET1-$V_{thp}$-NFET2-$V_{dd}$-NFET3-$V_{thp}$-NFET4-GND

The bottom device (NFET 4) is biased between $V_{thp}$ and ground, thus its body potential settles very close to ground. As previously described, this results in NFET4 having a higher threshold value than NFETs 1–3. Although this device is slower, the alternating precharge scheme taught by this invention results in NFETs 1–3 performing faster than in the conventional SOI technique of biasing all stack nodes to $V_{thp}$.

The preferred embodiment of the present invention provides stacks of three NFETS. However, the present invention also applies to all stacks greater than three.

Practically, logic device stacks are limited to stacks of four or less. However, the present invention is not necessarily limited as such.

The benefits of the present invention are several including eliminating the parasitic bipolar currents from a clocked domino logic circuit without sacrificing as much performance as the prior art technique (FIG. 3(B)). Furthermore, the present invention provides a logic circuit, which results in a faster discharge of the primary node in the circuit. Also, the present invention provides a logic circuit, which results in a substantial improvement in the logic performance of the chip.

While the invention is described in terms of preferred embodiments, those skilled in the art will recognize that the invention is practiced with modification within the spirit and scope of the appended claims. The same concept is applied to PFET based domino logic circuits, which stack the PFET devices instead of the NFETs. Also, this invention is intended for high performance SOI logic circuits, and is similarly applied to all SOI dynamic logic.

FIGURES

What is claimed is:

1. A SOI (silicon-on-insulator) circuit for reducing bipolar current comprising:
   a first input signal source;
   a first NFET device coupled to said first input signal source;
   a first PFET device coupled to said first input signal source;
   a second input signal source;
   a second NFET device coupled to said second input signal source;
   a second PFET device coupled to said second input signal source;
   a first NFET stack node coupled to said first PFET device, said first NFET device, and said second NFET device;
   a third input signal source;
   a third NFET device coupled to said third input signal source;
   a third PFET device coupled to said second PFET device;
   a power supply voltage source coupled to said third PFET device; and
   a second NFET stack node coupled to said second PFET device, said second NFET device, and said third NFET device.

2. The circuit of claim 1, wherein said first input signal source causes said first NFET stack node to be precharged to a body-effected threshold voltage of said first PFET device.

3. The circuit of claim 1, wherein said first input signal source causes said first NFET device to have a body potential in between a power supply voltage and a body-effected threshold voltage of said first PFET device.

4. The circuit of claim 1, wherein said second input signal source causes said second NFET device to have a body potential in between a body-effected threshold voltage of said second PFET device and a power supply voltage.

5. The circuit of claim 1, wherein said second input signal source and said third input signal source causes said second NFET stack node to be precharged to a power supply voltage through said second and third PFET devices.

6. The circuit of claim 1, wherein said third input signal source causes said third NFET device to have a body potential in between said power supply voltage and ground.

7. A system for reducing bipolar current in a SOI (silicon-on-insulator) logic gate circuit, the system comprising:
   a first portion operatively connected to a second portion such that the system alternates from a precharge high mode to a precharge low mode, the second portion comprising:
   an input signal source;
   a NFET device coupled to the input signal source;
   a PFET device coupled to the input signal source;
   a first NFET stack node for providing a drain region to the NFET device at a body-effected threshold voltage; and
   a second NFET stack node, coupled to the PFET device, for providing a source region to the NFET device at a body-effected threshold voltage.

8. The system of claim 7, wherein the input signal source causes the second NFET stack node to be precharged to the power supply voltage.

9. The system of claim 7, wherein the input signal source causes the NFET device to have a body potential in between a body-effected threshold voltage of the PFET device and the power supply voltage.

10. A system for reducing bipolar current in a SOI (silicon-on-insulator) logic gate circuit, the system comprising:
- a first portion operatively connected to a second portion such that the system alternates from a precharge high mode to a precharge low mode, the second portion comprising:
  - an input signal source;
  - a power supply voltage source;
  - a NFET device coupled to the input signal and having a source region connected to ground;
  - a first PFET device coupled to the input signal source and the power supply voltage source; a
  - second PFET device coupled to the first PFET device; and
  - a NFET stack node coupled to the second PFET device, the NFET device providing a drain region at a power supply voltage to the NFET device.

11. The system of claim 10, wherein the input signal source causes the NFET device to have a body potential in between the power supply voltage and the ground.

* * * * *